(12) United States Patent
Jovenin et al.

(10) Patent No.: US 6,278,871 B1
(45) Date of Patent: Aug. 21, 2001

(54) INTEGRATED CIRCUIT INCLUDING A LOW-DISPERSION CAPACITIVE NETWORK

(75) Inventors: Fabrice Jovenin; Benoît Butaye, both of Caen (FR)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/467,593

(22) Filed: Dec. 20, 1999

(30) Foreign Application Priority Data

Dec. 29, 1998 (FR) .................................................. 98 16565

(51) Int. Cl.[7] .............................. H04B 1/26; H04B 15/00
(52) U.S. Cl. .......................... 455/313; 455/315; 455/333; 257/295; 257/347; 257/327
(58) Field of Search ..................................... 455/313, 315, 455/334, 333; 257/295, 532, 306, 9, 347, 327

(56) References Cited

U.S. PATENT DOCUMENTS

| | | | |
|---|---|---|---|
| 4,685,197 | 8/1987 | Tigelaar et al. ...................... | 437/195 |
| 5,189,594 | * 2/1993 | Hoshiba ................................ | 257/295 |
| 5,275,974 | * 1/1994 | Ellul et al. ........................... | 437/203 |
| 5,291,438 | * 3/1994 | Witek et al. .......................... | 365/149 |
| 5,448,772 | * 9/1995 | Grandfield ........................... | 455/333 |
| 5,583,359 | * 12/1996 | Ng et al. .............................. | 257/306 |
| 5,807,775 | * 9/1998 | Tseng .................................... | 438/253 |
| 6,100,574 | * 8/2000 | Norstrom et al. ................... | 257/532 |

FOREIGN PATENT DOCUMENTS

0772246 A1   5/1997   (EP) .............................. H01L/29/92

* cited by examiner

*Primary Examiner*—William Trost
*Assistant Examiner*—Marlean Milord

(57) ABSTRACT

The present invention relates to an integrated circuit comprising a series of conducting layers (1) ... (6), separated in pairs by insulating layers, including a capacitive element CF formed by a stack of conducting layers cut out of the conducting layers.

According to the invention, the capacitive element CF comprises as many conductive plates as the integrated circuit has conducting layers.

The invention enables to maximize the reduction of the influence of each of its manufacturing steps on the real value of the capacitive element CF.

6 Claims, 2 Drawing Sheets

INTEGRATED CIRCUIT INCLUDING A LOW-DISPERSION CAPACITIVE NETWORK

FIELD OF THE INVENTION

The present invention relates to an integrated circuit comprising a series of layers formed by low-resistance materials called conducting layers, separated in pairs by layers of insulating material called insulating layers, which integrated circuit includes a first capacitive element offering between a first and a second terminal a capacitance of fixed value, said capacitive element being formed by a stack of conducting plates cut out of the conducting layers and electrically insulated from said layers.

BACKGROUND OF THE INVENTION

U.S. Pat. No. 4,685,197 describes an integrated circuit that includes a capacitive element formed by two conducting layers separated by an insulating layer and mentions, without describing an embodiment thereof, the possibility of using more than two conducting layers to increase the value of the capacitance of such a capacitive element.

SUMMARY OF THE INVENTION

The present invention is linked with the following considerations: The realization of such a capacitive element in integrated form requires a series of manufacturing steps of which the number is a function of the number of conducting layers included in the capacitive element. Each manufacturing step introduces imperfections in the integrated circuit, which cause a difference of the real value of the capacitance of the capacitive element relative to its nominal value.

During mass production, it may happen that the same manufacturing step causes offsets to occur whose values are different from one integrated circuit to another. The extent of these differences is called dispersion. Such differences introduce an uncertainty in the real values of the capacitances of the capacitive elements included in the integrated circuits thus produced, which values may vary considerably from one integrated circuit to another. This uncertainty turns out to be very bad when these integrated circuits are intended for applications where the real value of the capacitance they contain is to be precisely known.

A systematic measurement of the real value of the capacitance included in each integrated circuit at the end of production is unrealistic, for it is difficult and expensive to achieve repetitively. Moreover, the detection of a too large offset relative to the nominal value will only lead to the rejection of the thus identified integrated circuit, which will lower the production efficiency. It is thus preferable to reduce the dispersion in a preventive manner by means of an appropriate design of the integrated circuit.

It is an object of the present invention to remedy these drawbacks described above by proposing an integrated circuit that includes a capacitive element whose real value can be predicted more easily and is less vulnerable to isolated influences of each of the manufacturing steps of the circuit.

Indeed, an integrated circuit in accordance with the opening paragraph is characterized according to the invention in that the first capacitive element comprises as many conducting plates as the integrated circuit comprises conducting layers, the first and the second terminal of the first capacitive element being connected to the conducting plates that form the ends of the stack.

The construction of the first capacitive element included in the integrated circuit according to the invention requires the largest possible number of manufacturing steps, since all the conducting layers are present therein. This implies that the relative influence of each of these manufacturing steps on the real value of the capacitance thus produced is reduced to the highest degree. Thus, the extent of the differences from one circuit to another between the offset of the real value of the capacitance and its nominal value, that is to say, the dispersion, is also reduced considerably. The real values of the capacitances of the capacitive elements included in a set of integrated circuits in conformity with the invention will thus be comprised in a shorter interval and may thus be more easily predicted.

In a particular embodiment of the invention, an integrated circuit as described above, comprising a substrate that is used as a support for an alternating series of N insulating layers and N conducting layers numbered in rising order from the substrate, is characterized in that the $i^{th}$ conducting plate of the first capacitive element (for i=3 to N) is connected to the $(i-2)^{th}$ conducting plate of said capacitive element, the first and the second terminal of the first capacitive element being connected to its first and its $N^{th}$ conducting plate, respectively.

The capacitive element thus obtained consequently includes N-1 capacitors arranged in a parallel combination, each formed by two conducting layers separated by an insulating layer that acts as a dielectric.

A particular embodiment of the invention is characterized in that a first bulk, which has a given type of conductivity, is installed inside the substrate, so that the stack that forms the first capacitive element is superposed on said bulk, which bulk is connected to the surface of the substrate covered by said stack via an area that has the same type of conductivity as the bulk.

In this embodiment, an additional capacitor appears between the first conducting layer and the area connecting the surface of the substrate to the first bulk, which thus forms an additional conducting layer and introduces another manufacturing step in the manufacturing process of the integrated circuit, which further reduces the influences relating to each of the manufacturing steps on the real value of the capacitance of the first capacitive element. The dispersion is thus further reduced.

In an advantageous embodiment of the invention, the first bulk is connected to a reference terminal forming the ground of the integrated circuit.

Such an embodiment enables to get the capacitance under control that exists between the first conducting layer and the substrate. The first capacitive element will thus present a better quality factor.

A variant of the invention offers an integrated circuit as described above, characterized in that it further includes a second capacitive element, intended to develop between a first and second terminal a capacitance whose value depends on a tuning voltage applied to the first terminal, the second terminal of the second capacitive element being connected to one of the terminals of the first capacitive element.

This variant enables to have a variable capacitor, while the number of manufacturing steps necessary for manufacturing the integrated circuit is further increased. Indeed, the second capacitive element will most often be an active element that calls for specific diffusions.

In a preferred embodiment of the invention, an integrated circuit as described above is characterized in that the second capacitive element is a varicap diode, built on top of a second bulk that has a given conductivity type installed inside the substrate, of which a cathode and an anode form the first and the second terminal, respectively.

In another variant of the invention, an integrated circuit as described above further includes an inductive element of which a first terminal is connected to a supply terminal and of which a second terminal is connected to the second terminal of the first capacitive element, thus forming an output terminal of an oscillator intended to deliver an output signal whose frequency depends on the value of the tuning voltage.

Such an integrated circuit forms a voltage-controlled oscillator of which the evolution of the oscillation frequency as a function of the value of the tuning voltage is easily predictable because of the reduction of the dispersion, made possible by the invention.

If the present invention can be used in all types of applications involving capacitive elements of which the value must precisely be known, its use is particularly advantageous in receiving loops for receiving radio signals. The invention thus likewise relates to a radio signal receiving device comprising:

- an antenna and filter system enabling the reception of a radio signal of which the frequency, called radio frequency, is selected amidst a given range of frequencies, and its transformation into an electronic signal called radio signal,
- a mixer intended to receive the radio signal and a signal coming from a local oscillator whose frequency, called oscillation frequency, can be adjusted, and intended to deliver an output signal that has a fixed frequency and is equal to the difference between the radio frequency and the oscillation frequency, and
- a signal processing unit intended to use the output signal of the mixer, characterized in that the local oscillator is realized in the form of an integrated circuit as described above.

BRIEF DESCRIPTION OF THE DRAWINGS

These and other aspects of the invention are apparent from and will be elucidated, by way of non-limitative example, with reference to the embodiment(s) described hereinafter.

In the drawings.

DESCRIPTION OF PREFERRED EMBODIMENTS

Figure 1:
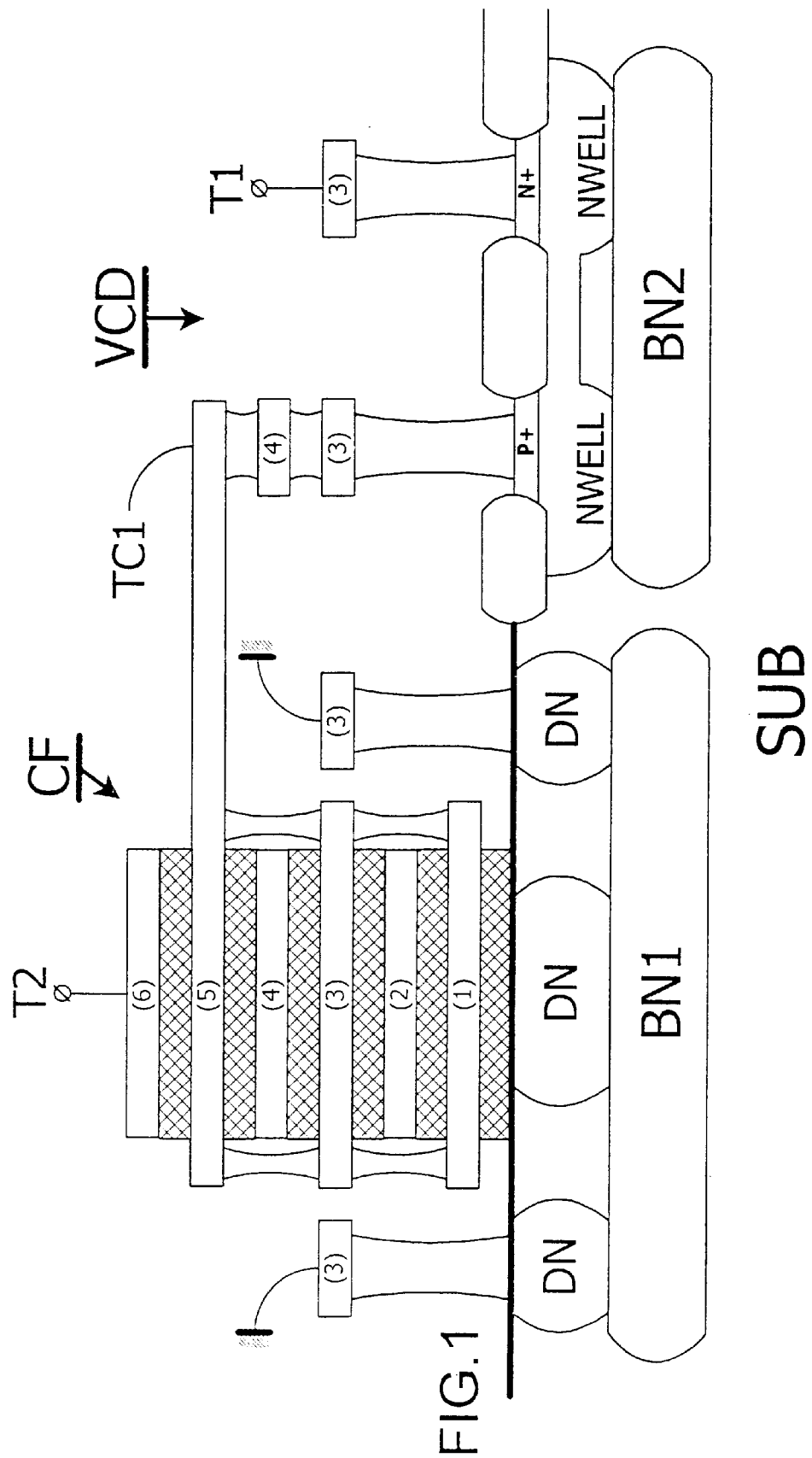
FIG. 1 is a cross-sectional view of part of an integrated circuit in accordance with a preferred embodiment of the invention.

FIG. 1 represents in the form of a cross-sectional view a part of an integrated circuit comprising a series of 6 layers of low-resistance materials called conducting layers, referenced (1) to (6) in increasing order from a substrate SUB over which they are disposed. These conducting layers (1) to (6) are separated in pairs by layers of insulating material called insulating layers represented in the form of hatched areas in this Figure. The layers (1) and (2) may be realized, for example, of polysilicon, and the layers (3) to (6) of metal. The integrated circuit includes a first capacitive element CF, which features between a first and a second terminal TC1 and T2 a capacitor having a nominalfixed value. This capacitive element CF is formed by a stack of conducting layers, cut out of the conducting layers and electrically insulated from said layers. The first capacitive element CF comprises as many conducting plates as the integrated circuit comprises conducting layers, while the first and the second terminal TC1 and T2 of the first capacitive element CF are connected to the conducting plates (1) and (6) that form the ends of the stack.

In the embodiment described here, the $i^{th}$ conducting plate of the first capacitive element CF (for i=3 to 6) is connected to the $(i-2)^{th}$ conducting plate of said capacitive element, the first and the second terminal TC1 and T2 of the first capacitive element CF being respectively connected to its first and sixth conducting plates (1) and (6). The present Figure describes only the contacts connecting the first, third and fifth conducting plates (1), (3) and (5), and the first terminal TC1 of the first capacitive element CF, the contacts connecting the second, fourth and sixth conducting plates (2), (4) and (6) not being situated in the same cross-sectional plane.

The difference existing between the real value and the nominal value of the capacitance of the first capacitive element CF included in such an integrated circuit is equal to the sum of the offsets caused by each of the manufacturing steps necessary for realizing the integrated circuit. Thus, the larger the number of these manufacturing steps, the smaller the relative influence of each of the steps is on the difference between the real value and the nominal value of said capacitance. In the integrated circuit described here, all the conducting layers are used for forming the first capacitive element CF, thus involving the largest possible number of manufacturing steps linked with the cutting out of said conducting layers. The relative influence of each of these steps on the real value of the capacitive element is thus reduced to its minimum, which enables to considerably diminish the dispersion.

In the embodiment of the invention described here, a first bulk BN1, which has a conductivity type N, is installed inside the substrate SUB, so that the stack forming the first capacitive element CF is superposed on said bulk BN1, which is connected to the surface of the substrate SUB covered by said stack via an area DN that has diffusion N. The first bulk BN1 is connected to a reference terminal forming the ground of the integrated circuit via two areas DN that have diffusion N, connected each via a contact to the third conducting layer (3) which forms in this example a ground plane for the integrated circuit.

In the absence of the first bulk BN1, a parasitic capacitance would appear between the first conducting layer (1) and the substrate SUB. This parasitic capacitance would, however, be separate from the first capacitive element CF and would degrade the quality factor thereof. The installation of the bulk BN1 and its link to the substrate surface SUB via the area having diffusion N consequently offers a twofold advantage: it introduces new manufacturing steps in the manufacturing process of the integrated circuit, thus permitting to further reduce the dispersion, and it enables to integrate the parasitic capacitance in the capacitance of the first capacitive element CF, and to get said parasitic capacitance described above under control by connecting the first bulk BN1 to the ground of the integrated circuit, which improves the quality factor of the first capacitive element CF.

In the preferred embodiment described here, the integrated circuit furthermore includes a second capacitive element VCD, intended to develop between a first and a second terminal a capacitance whose value depends on a tuning voltage applied to the first terminal, the second terminal of the second capacitive element VCD being connected to the first terminal, here called TC1, of the first capacitive element CF. The second capacitive element VCD is here a varicap diode installed over a second bulk BN2 of the N conductivity type installed inside this substrate SUB, of which a cathode and an anode form a first and a second terminal, respectively. The varicap diode VCD is realized here in MOS technology, its anode and cathode being formed respectively by diffusion regions P+ and N+ located on the surface of a well NWELL, itself disposed over the second bulk BN2.

The introduction of the second capacitive element VCD offers two advantages:

it enables to vary the value of the capacitance of the assembly formed by the first and the second capacitive element CF and VCD arranged in a series combination, and since it needs new manufacturing steps, it results in a diminishing of the dispersion.

Besides, the series combination of the first capacitive element CF, whose capacitance has a fixed value, with a second capacitive element leads to a linearization of the evolution of the value of the capacitance of the assembly thus formed in dependence on the value of the tuning voltage.

If, in this example, the second capacitive element is realized in the form of a MOS-type diode, it is possible to realize such a diode in bipolar technology, while the advantages described above are retained.

Figure 2:
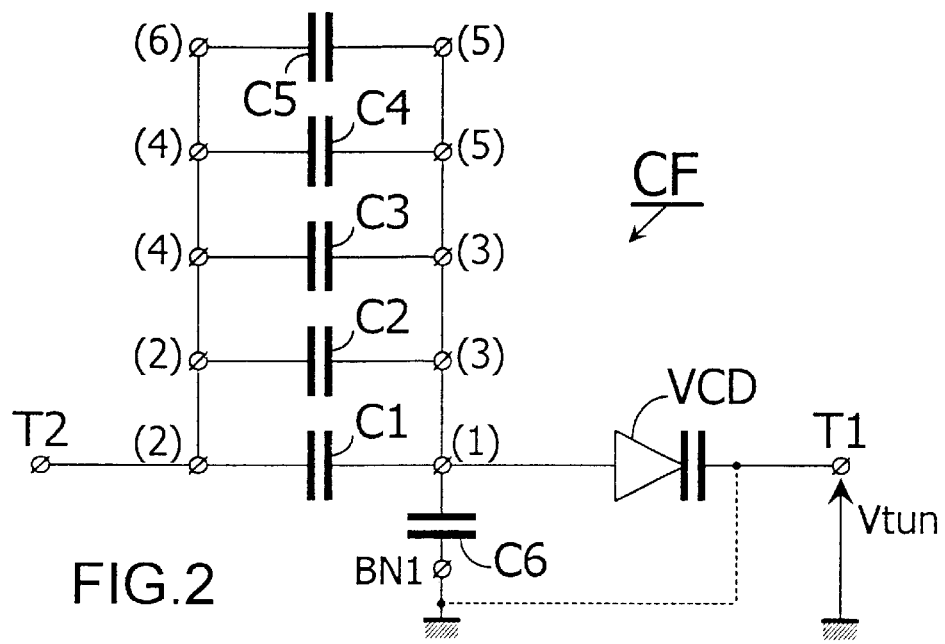
FIG. 2 is an electrical diagram representing part of an integrated circuit in accordance with this embodiment of the invention.

FIG. 2 is an electrical diagram equivalent to the part of the integrated circuit described above. The first capacitive element CF is represented therein as a parallel assembly of capacitors Ci (for i=1 to 5) which appear between two successive conducting layers (i) and (i+1), the insulating layer that separates them serving as a dielectric. In accordance with the preceding description, the first capacitive element CF moreover comprises a capacitor C6 that appears between the first conducting layer (1) and the first bulk BN1, which is connected to ground of the circuit. A second capacitive element VCD, represented in the form of a varicap diode, is arranged in a series combination with the first capacitive element CF, the assembly forming a capacitive branch that has a first and a second terminal T1 and T2. The second capacitive element VCD is intended to develop a capacitance whose value depends on a tuning voltage Vtun applied to the first terminal T1.

This tuning voltage basically being a DC voltage, the cathode of the varicap diode that forms the second capacitive element VCD is connected to ground of the circuit as far as small AC signals are concerned, which is equivalent to a connection between the first and second bulks BN1 and BN2 described previously. This virtual connection, represented in the form of a dotted line in the Figure, leads to an improvement of the quality factor of the first capacitive branch.

Figure 3:
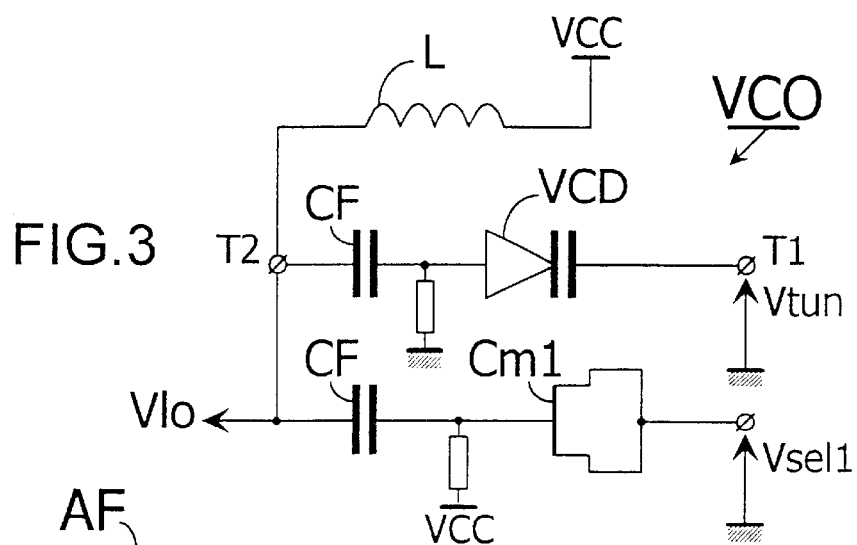
FIG. 3 is an electrical diagram representing part of an integrated circuit in accordance with another variant of the invention.

FIG. 3 is an electrical diagram of an integrated circuit in accordance with a variant of the invention which includes, in a parallel combination with the capacitive branch described above, an inductive element L of which a first terminal is connected to a supply terminal VCC and of which a second terminal is connected to the second terminal T2 of the first capacitive element CF. The assembly thus obtained forms a voltage-controlled oscillator VCO whose terminal T2 is an output terminal, intended to deliver an output signal Vlo whose frequency depends on the value of the tuning voltage Vtun.

The second capacitive element has thus far been described as being realized in the form of a MOS-type varicap diode. However, there may be envisaged to arrange, in a parallel combination with the above-described capacitive branch, a second capacitive branch formed by a series assembly of another capacitive element CF that has a fixed capacitance value with another varicap diode realized in bipolar technology and also biased by means of the tuning voltage Vtun. Such an embodiment, not represented in the drawing, will introduce new manufacturing steps in the manufacturing process of the integrated circuit and will further reduce the dispersion.

In the embodiment described here, another capacitive branch formed by the series assembly of a capacitive element CF, which has a fixed value, similar to those described above, with a capacitor Cm1 that can be switched by means of a selection voltage Vsel1. This switchable capacitor Cm1 enables to make a band selection. Besides, being realized in the form of an NMOS transistor, it introduces new manufacturing steps in the manufacturing process of the integrated circuit and will further reduce the dispersion. To make a finer band selection, one could choose to connect a plurality of such capacitive branches in parallel to the first capacitive branch.

Figure 4:
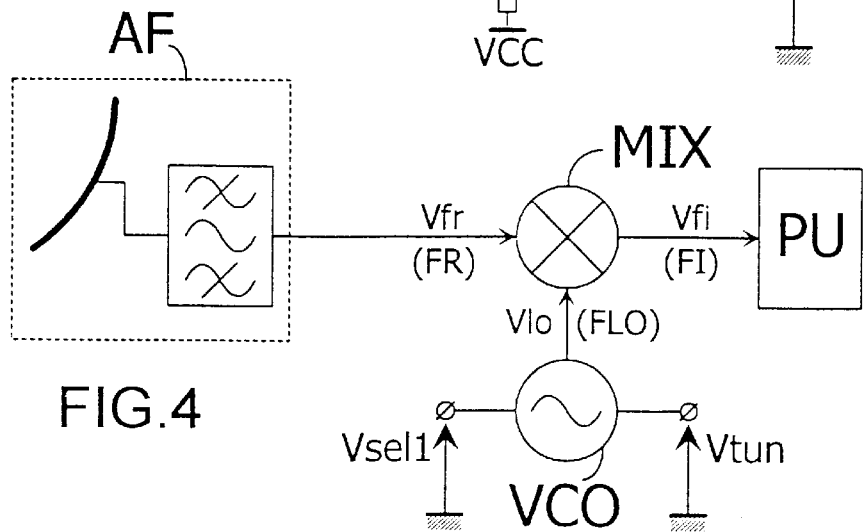
FIG. 4 is a partial functional diagram describing a radio signal receiving device that utilizes an integrated circuit in accordance with this variant of the invention.

FIG. 4 is a functional diagram scantily describing a radio signal receiving apparatus, for example, a radiotelephone, utilizing an integrated circuit in accordance with the variant of the invention described previously. This apparatus comprises an antenna and filter system AF that enables to receive a radio signal whose frequency FR, called radio frequency, is selected from a given range of frequencies, and its transformation into an electronic signal Vfr called radio signal. The apparatus further includes a mixer MIX intended to receive the radio signal Vfr and a signal Vlo coming from a local oscillator VCO, whose frequency FLO, called oscillation frequency, can be adjusted, and intended to deliver an output signal Vfi that has a frequency FI which is fixed and equal to the difference between the radio frequency FR and the oscillation frequency FLO. The apparatus finally includes a signal processing unit PU intended to use the output signal Vfi of the mixer MIX. The local oscillator VCO is realized in the form of an integrated circuit as described above, intended to receive a tuning voltage Vtun and a selection signal Vsel1, of which the values determine the value of the oscillation frequency FLO and thus the value of the radio frequency FR of the selected radio signal.

What is claimed is:

1. An integrated circuit comprising a series of layers formed by low-resistance materials called conducting layers, separated in pairs by layers of insulating material called insulating layers, which integrated circuit includes a first capacitive element offering between a first and a second terminal a capacitance of fixed value, the first capacitive element being formed by a stack of conducting plates cut out of the conducting layers and electrically insulated from said layers, characterized in that:

the first capacitive element comprises as many conducting plates as the integrated circuit comprises conducting layers, the first and the second terminal of the first capacitive element being connected to the conducting plates that form the ends of the stack a first bulk which has a given type of conductivity is installed inside the substrate so that the stack that forms the first capacitive element is superposed on said bulk, which bulk is connected to the surface of the substrate covered by said stack via an area that has the same type of conductivity type as the bulk.

2. An integrated circuit as claimed in claim 1, characterized in that the first bulk is connected to a reference terminal forming the ground of the integrated circuit.

3. An integrated circuit as claimed in claim 2, characterized in that it further includes a second capacitive element, intended to develop between a first and a second terminal a capacitance whose value depends on a tuning voltage applied to the first terminal, a second terminal of the second capacitive element being connected to one of the terminals of the first capacitive element.

4. An integrated circuit as claimed in claim 3, characterized in that the second capacitive element is a varicap diode, built over a second bulk having a given conductivity type installed inside the substrate, of which a cathode and an anode form the first and the second terminal, respectively.

5. An integrated circuit as claimed in claim 4, characterized in that it further includes an inductive element of which a first terminal is connected to a supply terminal, and of which a second terminal is connected to the second terminal of the first capacitive element, thus forming an output terminal of an oscillator intended to deliver an output signal whose frequency depends on the value of the tuning voltage.

6. A radio signal receiver, comprising:

an antenna and filter system enabling the reception of a radio signal of which the frequency, called radio frequency, is selected amidst a given range of frequencies, and its transformation into an electronic signal called radio signal, a mixer intended to receive the radio signal and a signal coming from a local oscillator whose frequency, called oscillation frequency, can be adjusted, and intended to deliver an output signal that has a fixed frequency and is equal to the difference between the radio frequency and the oscillation frequency, and a signal processing unit intended to use the output signal of the mixer, characterized in that the local oscillator is realized in the form of an integrated circuit that comprises:

a series of layers formed by low-resistance materials called conducting layers, separated in pairs by layers of insulating material called insulating layers, which integrated circuit includes a first capacitive element offering between a first and a second terminal a capacitance of fixed value, the first capacitive element being formed by a stack of conducting plates cut out of the conducting layers and electrically insulated from said layers, a second capacitive element, operably coupled to the first capacitive element, that is configured to develop a capacitance value depending upon a tuning voltage, and an inductive element, operably coupled to the first capacitive element, thus forming the local oscillator that is configured to provide the oscillation frequency that is dependent upon the tuning voltage, characterized in that:

the first capacitive element comprises as many conducting plates as the integrated circuit comprises conducting layers, the first and the second terminal of the first capacitive element being connected to the conducting plates that form the ends of the stack a first bulk which has a given type of conductivity is installed inside the substrate so that the stack that forms the first capacitive element is superposed on said bulk, which bulk is connected to the surface of the substrate covered by said stack via an area that has the same type of conductivity type as the bulk.

\* \* \* \* \*